US005500621A

United States Patent [19]

Katz et al.

[11] Patent Number: 5,500,621
[45] Date of Patent: Mar. 19, 1996

[54] TRAVELLING-WAVE TUBE PROTECTION ARRANGEMENT

[75] Inventors: Allen Katz, Robbinsville; Herbert J. Wolkstein, Livingston; James J. Meighan, III, Hamilton Square, all of N.J.

[73] Assignee: Martin Marietta Corp., East Windsor, N.J.

[21] Appl. No.: 416,111

[22] Filed: Apr. 3, 1995

[51] Int. Cl.⁶ ........................................ H03F 3/58
[52] U.S. Cl. .................... 330/43; 315/3.5; 315/39.3
[58] Field of Search ......................... 315/3.5, 3.6, 39.3; 330/43, 207 P, 297, 298

[56] References Cited

U.S. PATENT DOCUMENTS

| | | | |
|---|---|---|---|
| 4,323,853 | 4/1982 | Kurokawa | 330/43 |
| 4,742,294 | 5/1988 | Gallios | 315/3.5 X |
| 4,777,406 | 10/1988 | Ross et al. | 315/3.5 |
| 4,866,344 | 9/1989 | Ross et al. | 330/43 X |
| 4,899,113 | 2/1990 | Buikema | 315/3.5 X |

Primary Examiner—Steven Mottola
Attorney, Agent, or Firm—W. H. Meise; C. A. Berard; S. A. Young

[57] ABSTRACT

A travelling-wave tube (TWT) for a satellite communication system includes a cathode current regulator which compares a sensed $I_K$ signal with a cathode current reference to form an cathode current error signal, and controls the cathode current in response to the cathode current error signal. Helix arc protection is provided by a helix current shut-down, which compares the helix current with a particular reference, and shuts the TWT supply down when helix current flows. Desirable high efficiency TWTs have a small input drive range between maximum TWT output and a defocussed condition, in which beam current flows in the helix. Sudden changes in path attenuation may result in an RF overdrive condition, and cause helix current flow, and undesirably shut down the TWT. A helix current limiter senses the helix current, and compares it with a reference which represents less helix current than that which causes shutdown, to produce a helix current error signal. The helix current error signal adjusts the cathode current reference, to thereby reduce the cathode current in a feedback manner, to thereby tend to maintain the helix current constant at a value below the shut-down helix current.

6 Claims, 2 Drawing Sheets

TRAVELLING-WAVE TUBE PROTECTION ARRANGEMENT

FIELD OF THE INVENTION

This invention relates to power supplies for driving travelling-wave tubes, and particularly to such tubes which are used in spacecraft.

BACKGROUND OF THE INVENTION

Communications and broadcast satellites, and other communications arrangements, must transmit electromagnetic radiation at relatively high frequencies, on the order of 2 to 20 Ghz., and at power in excess of 10 watts. Such spacecraft include a plurality of radio-frequency (RF) power amplifiers, which generate the power required for communications transmissions. The solar panels, batteries, and power regulators of the spacecraft provide the electrical power to operate the amplifiers. In general, solid-state power RF devices are preferred to vacuum tubes for spacecraft use because of their light weight, ruggedness, and long life. For communication spacecraft use, light weight, reliability, and power conversion efficiency (efficiency in converting DC power to radio-frequency or RF power) are all important considerations. However, solid-state devices at the current state of the art do not approach the conversion efficiency of travelling-wave amplifier tubes for RF power generation. This provides the travelling-wave tube with a distinct advantage over solid-state devices for a spacecraft, where the available electrical power is limited. Also, travelling-wave tubes are available which are sufficiently rugged to withstand spacecraft launch forces, and which have a lifetime which, although finite, is greater than the expected lifetime of a spacecraft. Travelling-wave tubes have the advantage of greater amplification gain than typical solid-state devices, and are relatively broadband. For this reason, travelling-wave tubes currently dominate the RF power applications of communications spacecraft. Each tube is generally associated with one communication channel, and the spacecraft may carry as many as a few tens of travelling-wave tubes, thereby providing a few tens of broadband communication channels.

Travelling-wave amplifier tubes have certain disadvantages by comparison with solid-state amplification devices, notably in that the power-supply voltages are in the range of thousands of volts, which poses voltage breakdown problems in the components of the power supply, and also creates the potential for corona or current leakage in the vacuum of space. The travelling-wave amplifier tube includes a slow-wave structure in the form of a helix, which carries RF signal. The helix is made from thin wire because of characteristic impedance considerations. Voltage breakdown inside the travelling-wave tube may result in an arc between the anode or cathode and the helix wire, which causes direct current to flow in the helix wire. The helix wire heats in response to the flow of the arc current, and if such current is prolonged, melts the helix wire, thereby resulting in destruction of the tube.

The cost of fabricating and launching a communication spacecraft is many tens of millions of dollars, and each communication channel of the spacecraft may have a rental value in the range of one million dollars per month. It is very important to avoid destruction of travelling-wave tubes on the spacecraft, to avoid the loss of the associated communications channels and the consequent loss of revenue, and, in the limit, to avoid the need for fabrication and launch of a replacement spacecraft due to excessive reduction in the number of available channels, before the spacecraft becomes inoperative for lack of attitude control and stationkeeping propellant.

Conventionally, each travelling-wave tube in a spacecraft is fitted with its own electronic power conditioner (EPC), which produces direct voltages (often referred to as DC) for operating the tube. The EPC is arranged to shut down or de-energize in the event of an internal arc to the helix in the tube, so that an arc cannot cause current flow for a period sufficient to melt the helix wire. For this purpose, helix current is monitored by way of the helix voltage regulator in relation to ground. Under ordinary operating conditions, the electron beam travelling from the cathode of the travelling-wave tube to the collectors is magnetically focussed, so that it travels through the center of the helix, without causing any significant current in the helix. Thus, the helix current is near zero under normal operating conditions, and the presence of an arc can be established by monitoring the helix current, and enabling the shut-down protection whenever the helix current exceeds a predetermined threshold. The threshold may be selected to be, for example, three or four milliamperes (mA).

As mentioned above, the DC-to-RF conversion efficiency of the travelling-wave tube is one of its major advantages over solid-state devices for use on spacecraft. The manufacturers of travelling-wave tubes have, over time, generated new types of tubes, some with improved DC-to-RF conversion efficiency.

It has been found that at least some of the travelling-wave tube types having the highest DC-to-RF conversion efficiency also tend to trip their helix overcurrent protectors more often than less-efficient tubes. In the context of communication spacecraft, this is very undesirable, because overcurrent tripping results in shut-down of the associated travelling-wave tube, which in turn shuts down the communication channel with which it is associated. If it were possible to restart the travelling-wave tube immediately after the shut-down, the increased incidence of shut-downs might be tolerable. However, once a travelling-wave tube is shut down, it takes several minutes before the tube can be reactivated. This is because the manufacturer of the tube specifies a warm-up period; the warm-up period includes a one-minute ramp-up of the filament voltage, followed by a four-minute delay before application of high voltage, to prevent excessive thermal stress. Thus, the more frequent tripping of the travelling-wave tube power supply protection due to helix overcurrent may result in extended periods during which the communication channel is out of service. Such a situation is intolerable to those using the channels, and to the spacecraft operators who provide the channels.

It has been discovered that, in those high-conversion-efficiency travelling-wave tubes which suffer from frequent shut-downs, the normal operating point of the travelling-wave tube, at which the electron beam is focussed, the helix current is low, and the gain and output power is high, is within a very few decibels (dB) of tube saturation, at which the electron beam becomes defocussed, intercepts the helix, and results in helix current flow. For example, one type of tube has been found to transition from normal operation at full power to an overdriven condition in as little as two dB of input RF drive.

The signal paths of satellite communications channels are controlled by sophisticated systems including automatic gain and signal level controls, which tend to maintain the system operating levels under a wide variety of conditions.

However, the communication channel path includes uplinks and downlinks between the ground station and the spacecraft, and both are subject to path loss variations due to random weather events, which may also affect the signal polarization. The combination of the path loss and polarization variations can result in relatively sudden signal level changes in the uplink signal received at the spacecraft. Notwithstanding the automatic level and other controls, the travelling-wave tube may experience signal level changes at its RF input terminal or port which are sufficiently large to move its operating point by one or two dB, and into the overdrive region. This, in turn, could result in shutdown of the channel due to the sensing of excessive helix current.

The use of higher-efficiency DC-to-RF converters is desirable in spacecraft communications channels, without excessive channel disruptions due to shut-down of the power supplies, while still maintaining positive protection for the conversion device.

SUMMARY OF THE INVENTION

A powering arrangement for a travelling-wave tube includes a controllable cathode controlled current loop or voltage supply. A shut-down comparator compares a helix current signal of the tube with a particular reference value, and triggers power-supply shut-down when the helix current exceeds the particular value. A controllable cathode current reference signal generator is provided. An error amplifier compares the cathode current with the cathode current reference signal, and produces an error signal which is coupled to a control input port of the anode driver supply, poled to close a degenerative feedback loop, by which the cathode current tends to be held in a fixed ratio to the cathode current reference signal. A helix current error signal generator compares the helix current signal with a reference, and generates a helix current error signal, which is applied to the control input port of the cathode current reference signal generator, with a polarity selected for closing a degenerative feedback loop which tends to limit the helix current to (or maintain the helix current at) a constant value less than the particular value at which shut-down takes place.

BRIEF DESCRIPTION OF THE DRAWINGS

FIG. 1b is a simplified block diagram of a portion of the driver of FIG. 1a.

DESCRIPTION OF THE INVENTION

Figure 1A:
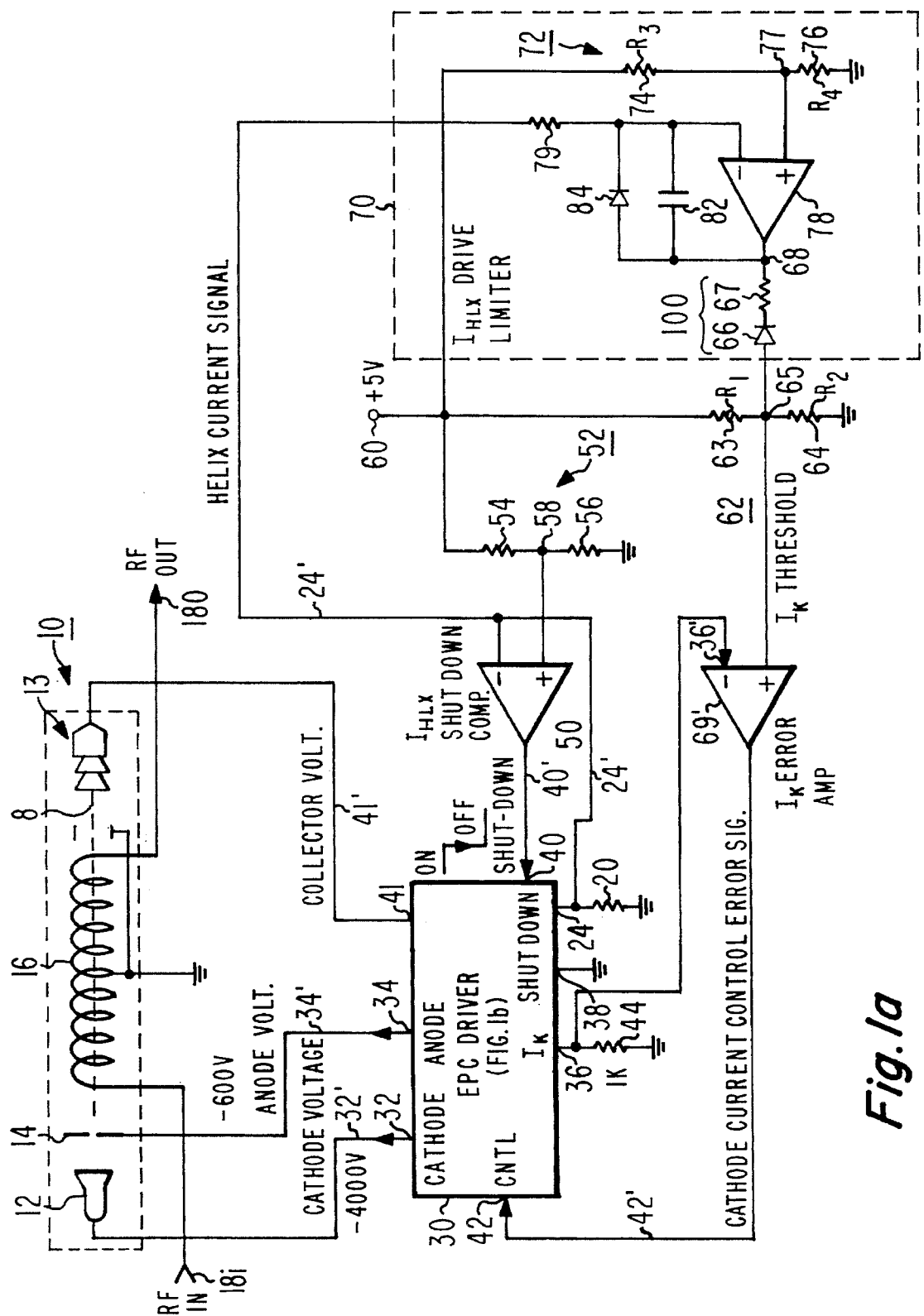
FIG. 1a is a simplified block diagram of the power portions of a TWT, its power supply, and power supply controls in accordance with an aspect of the invention.

In FIG. 1a, a travelling-wave tube (TWT) designated generally as 10 includes a cathode 12 which emits electrons, illustrated as a dash line 8, which are accelerated by electric fields extending between cathode 12, an electron beam forming anode 14, and a plurality of collectors designated together as 13. Electron beam 8, under normal operating conditions, passes through the center of a helical coil 16 of small-diameter wire, and is focussed by magnets (not illustrated), so that the focussed beam 8 does not impinge on the helix 16, and does not result in significant electron current flow in the helix. The electron beam is collected by collectors 13. As known to those skilled in the art, radio-frequency (RF) signals can be applied to an input terminal or port 18i of helix 16, and appears in amplified form at output port 18o, at the other end of helix 16. A typical communication spacecraft may include several tens of such travelling-wave tubes, each of which is associated with a broadband communication channel.

Prior-art travelling-wave tube amplifiers such as 10 of FIG. 1a are powered individually by EPCs or power supplies, such as that illustrated as a block 30. Such EPCs, in a spacecraft context, may be powered by a parallel combination of batteries recharged by solar panels. Often, the TWTs and their EPCs may be the largest users of electrical power in the spacecraft, so high conversion efficiency is of great importance. Power supply 30 of FIG. 1a includes a cathode voltage output port 32, an anode voltage output port 34, multiple collector output ports 41, for supplying energizing voltages to the corresponding elements by way of paths 32', 34', and 41', and supply 30 may include other ports, not illustrated, for supplying power to other portions of the TWT. EPC 30 maintains the anode 14 several thousand volts positive with respect to the cathode 12. It is desirable to maintain the helix at or near ground voltage, to simplify RF coupling and helix current sensing. As a result of the desire to maintain the helix at ground, the cathode voltage is maintained at a large negative voltage, and the anode is maintained at a small negative voltage. In one embodiment of the invention, the cathode voltage relative to chassis ground is in the vicinity of −4000 volts, and the anode is at a voltage of −300 ±300 volts. The range of voltages on the anode provides for control of the cathode current, as described below.

Power supply or EPC 30 of FIG. 1a includes a "shut-down" input port 40. When a shut-down signal, in the form of the negative-going voltage transition, is applied to shut-down port 40 of power supply 30, the power supply de-energizes the TWT 10 by reducing the voltages at its cathode port 32 collectors at port 41 and its anode port 34 to zero. This may be accomplished, for example, by deenergizing the power supply 30.

Power supply 30 of FIG. 1a further includes a cathode current ($I_K$) sense port 36, which is coupled to ground by a cathode current sense resistor 44. The cathode current produced at port 32 is controlled in response to a cathode current control error signal applied to a control (CNTL) input port 42. In general, the cathode-to-anode voltage difference establishes the cathode current of TWT 10, with a sensitivity, in one embodiment of the invention, of about 40 volts per milliampere of cathode current (within the normal dynamic range of the TWT). A TWT cathode current control feedback loop is established by a cathode current error amplifier 69, which has (a) its inverting (−) input port connected to cathode current sensing resistor 44, (b) its noninverting (+) input port connected to a controllable cathode current reference, in the form of a voltage source designated generally as 62, and (c) its output port connected by way of a path 42' to control input port 42 of power supply 30. The polarity of the cathode current control loop is set to establish a degenerative condition, as known in the art, for controlling the magnitude of the cathode current of the TWT as an analog of the voltage applied from controllable cathode current reference source 62 to amplifier 69.

As is common in feedback control loops, controllable cathode current reference source 62 of FIG. 1a takes the form of a voltage divider including serially connected resistors 63 and 64, connected across a reference voltage supply source 60. The desired reference voltage which controls the cathode current feedback loop is generated at a tap 65 between the resistors.

Helix 16 of TWT 10 of FIG. 1a has its turns connected to ground. As described in more detail below, electron beam current flow in TWT 10 normally flows in a loop which does not include ground. When helix 16 receives electrons arising from either an internal arc within tube 10 or from defocussing of electron beam 8, electron current flows to ground, and returns to EPC 30 through resistor 20. This current flow through resistor 20, which only occurs when helix current is drawn, causes a positive voltage across, or at the sensing end of, the resistor, and on path 24'. The positive voltage produced on signal path 24' is the helix current sense signal. The helix current sense signal across resistor 20 is coupled to the inverting (−) input port of a helix current shutdown comparator 50. The noninverting input port (+) of comparator 50 is connected to a reference voltage source, which consists of a reference positive voltage supply designated generally as 60, across which is coupled a voltage divider 52, including resistors 54 and 56, with a tap 58 therebetween at which the reference voltage appears. The output port of helix current shutdown comparator 50 is connected to shutdown input port 40 of power supply 30. Under ideal operating conditions, no helix current flows in helix current sense resistor 20, and the voltage on signal path 24' is zero. Consequently, the inverting input port of comparator 50 is at zero volts, and a positive reference voltage appears at tap 58, with the result that the output of comparator 50 is a high positive value, or at "logic 1" in a digital system. The occurrence of an arc from the cathode 12 or anode 14 (or from any other TWT structure at a negative voltage) to helix 16 causes electron flow in resistor 20 which drives the voltage on signal path 24' sharply positive. When the positive helix current sense voltage on signal path 24' exceeds the positive reference voltage at tap 58, comparator 50 couples a negative-going transition to the shut-down input port 40 of EPC 30, to initiate shut-down.

As mentioned above, defocussing of the electron beam 8 of TWT 10 of FIG. 1a due to RF signal drive levels slightly above nominal may cause current flow in helix 16, and also causes a positive voltage to appear on signal path 24. This voltage is indistinguishable from that due to an arc, and if the helix current increases sufficiently due to defocussing, the shut-down procedure will be initiated. Thus, RF input signal levels slightly above nominal may trigger shut-down of the TWT.

According to an aspect of the invention, voltage source 62, which is the cathode current reference for the cathode current control loop of FIG. 1a, includes an impedance 100 connected to tap 65 and to a control input port 68 of the cathode current reference source 62. As illustrated in FIG. 1a, the impedance consists of a unidirectional current conducting device in the form of a diode 66, connected in series with a resistor 67. Diode 66 is poled so that a control voltage applied to input port 68 which is more positive than the voltage at tap 65 will reverse-bias the diode, and have no effect on the cathode current control reference voltage applied to amplifier 69, and so that a control voltage applied to input port 68 which is more negative than the voltage at tap 65 will tend to cause diode 66 to conduct, and, in the limit, to effectively parallel resistor 64 by resistor 67. This tendency to parallel resistor 64, in turn, affects the division ratio of the voltage divider of reference source 62, and changes the reference value. Thus, a more positive voltage more positive than the tap voltage, when applied to port 68, will have no effect, while a more negative voltage will tend to reduce the reference voltage at tap 65. When the reference voltage at tap 65 is reduced, the feedback loop will therefore tend to reduce the TWT cathode current. The offset voltage and dynamic impedance of diode 66 are swamped by the gain of the feedback loop, and do not affect the result.

According to a further aspect of the invention, a further degenerative feedback loop is formed by a helix current ($I_{HLX}$) drive limiter designated generally as 70 in FIG. 1a, which is connected to helix current signal path 24' and to control input port 68 of controllable cathode current reference voltage source 62. Helix current drive limiter 70 includes a further reference voltage source designated generally as 72, which includes resistors 74 and 76 connected as a voltage divider across reference voltage supply 60, with the reference voltage at tap 77 being connected to the noninverting input port of an error amplifier 78. The inverting input port of error amplifier 78 is connected to helix current signal path 24' by way of a limiting resistor 79. Limiting resistor 79, in conjunction with a frequency compensation network illustrated as a capacitor 82, causes error amplifier 78 to have a low-pass filtering function. Compensation network 82 limits the frequency bandwidth of the $I_{HLX}$ drive limiter to be about a decade (10:1) above the bandwidth of the cathode current control amplifier 69. In one embodiment of the invention, the bandwidth of $I_{HLX}$ drive limiter 70 is about 1 KHz. A further diode 84 has its anode coupled to the output port of error amplifier 78, and its cathode connected to its inverting input port, for limiting the dynamic range of limiter 70 for best transient response.

Figure 2:
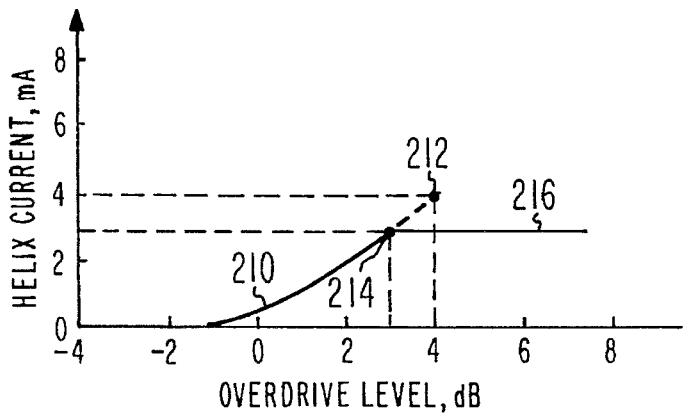
FIG. 2 is a plot of helix current as a function of RF overdrive both with and without the helix current feedback limiting portion of the invention.

Thus, the arrangement of FIG. 1a includes a first feedback loop, including cathode current error amplifier 69, which maintains the TWT cathode current at a constant value, so long as no helix current is drawn. When an overdrive condition occurs, the TWT beam tends to become defocussed, and some helix current flows. FIG. 2 illustrates a plot 210 of helix current as a function of RF overdrive. In FIG. 2, plot 210 has a value of less than one milliampere of helix current at RF overdrive levels less than 0 dB, but the amount of helix current increases rapidly above zero dB overdrive. In the absence of a helix current limiting arrangement according to the invention, the helix current 210 would reach point 212 in the vicinity of 4 mA at +4 dB of overdrive, and would trip the helix overcurrent shut-down protector. A second feedback loop, which includes amplifier 78, controllable reference 62, and error amplifier 69 of FIG. 1a, comes into play when the helix current reaches point 214, and tends reduce the cathode-to-anode voltage difference, to thereby reduce the cathode current in response to any tendency of the helix current to increase past the value (about 3 mA illustrated) at point 214 of FIG. 2. The second feedback loop therefore tends to hold the increasing helix current near a constant value, illustrated as portion 216 of FIG. 2, which is less than the helix current (point 212) which causes the helix current shutdown protection circuit, including comparator 50, to operate. Thus, RF overdrive conditions make the anode voltage more negative, to thereby reduce the cathode current, which in turn tends to limit the helix current to a value below the shut-off trip value. This, in turn, prevents shut-down of the TWT due to momentary RF overdrive conditions. The helix current shut-down trips immediately, just as it would in the absence of the invention, when the helix current rises above a predetermined value. An arc cannot cause the helix current limiting loop to operate, because the helix current limiting loop has a low-pass characteristic attributable to the effects of frequency compensation network 82, and it will not respond significantly to sudden changes such as an arc, and also because the helix current limiting loop has a limited range.

Figure 1B:
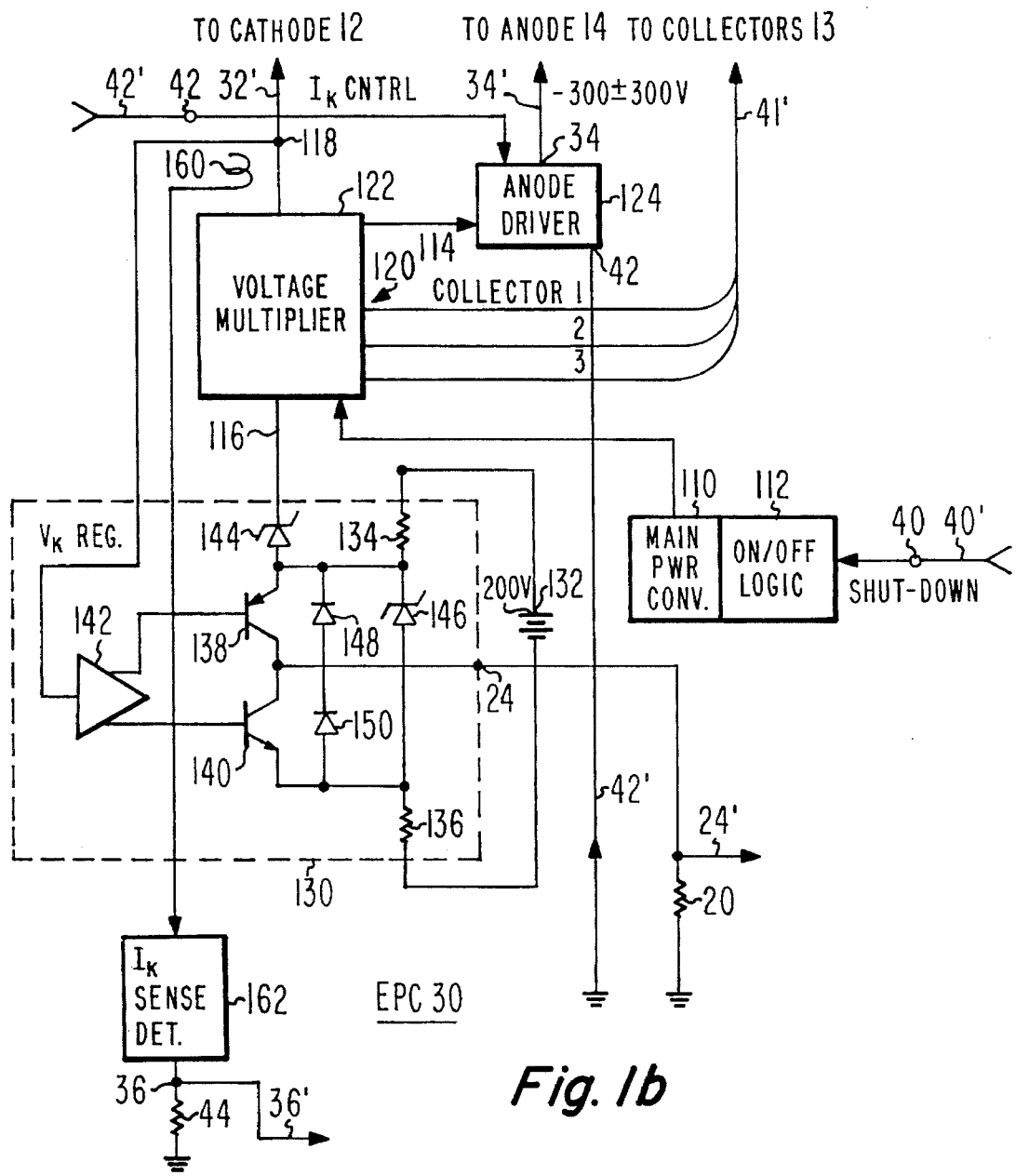

FIG. 1b is a simplified block diagram which illustrates some details of EPC 30 of FIG. 1a. In FIG. 1b, a main power converter 110 is controlled by on-off logic 112, which in turn receives shut-down control signals from port 40. Power converter 110 is coupled to a stack of voltage multipliers illustrated as a block 114, which has a helix regulator output terminal 116, and which produces a high negative voltage at a terminal 118, for application to the cathode of the TWT by way of path 32', and which also produces lesser negative voltages on terminals 120, for application by way of paths 41' to the collectors of the TWT. Voltage multiplier 114 also produces about −600 volts at a terminal 122, for application as a source to an anode voltage regulator.

The helix regulator output terminal 116 of voltage multiplier 114 of FIG. 1b is connected to ground by way of helix regulator driver 130, which is coupled to the cathode voltage output port 118, to sense the cathode voltage, and to adjust the voltage at the helix regulator output terminal 116 sufficiently to maintain the cathode voltage at terminal 118 constant. For this purpose, a direct voltage supply 132, which may have a value of, for example, 200 volts, is connected by way of dropping resistors 134 and 136 across the main current conducting (collector-to-emitter) paths of a pair of a complementary NPN-PNP bipolar transistors 138, 140. The emitters of transistors 138, 140 are connected together and to ground by way of helix current sensing resistor 20. Thus, the emitters of transistors 138 and 140 are at, or near, ground. The bases of transistors 138 and 140 are driven by an error-amplifier/driver illustrated as 142, to close a degenerative feedback loop which controls the helix regulator output at terminal 116, to maintain a constant voltage at terminal 118 and at the cathode of the TWT. Transistor protection and range limiting are provided by a further zener diode 146, and by diodes 148 and 150. When driven by error-amplifier/driver 142, one or the other of transistors 138, 140 has greater conduction than the other, which results in "push-pulling" voltage multiplier helix regulator output terminal 116. For example, when transistor 138 is nonconductive and transistor 140 is conductive, the negative terminal of supply 132 is pulled toward ground potential, with the result that the collector of nonconducting transistor 138 is pulled more positive. Similarly, when transistor 138 conducts more than transistor 140, the helix regulator output at 116 is drawn closer to ground potential, and makes the voltage at cathode voltage terminal 118 more negative.

Cathode current is monitored by a sensor including a transformer illustrated as a winding 160, which co-acts with a chopper and detector 162, to produce the desired current sense signal at output port 36.

Anode voltage regulator 124 produces an anode voltage at port 34 for application to the anode of the TWT by way of path 34', under the control of a cathode current control signal applied to block 124 by way of signal path 42' and port 42. Anode voltage regulator 124 may be any conventional type of regulator, which adjusts the anode voltage, as described above, to maintain the desired cathode current.

Those skilled in the art will recognize that current flow from terminal 118 of voltage multiplier 114 of FIG. 1b through the cathode 12 of TWT 10, to the anode 14 or collectors 13, and back to the voltage multiplier, does not include a path through ground. Consequently, during normal operation of the TWT, no appreciable current flows through resistor 20 of FIGS. 1a and 1b. When helix current flows, the helix current must flow to ground, and returns to the voltage multiplier through resistor 20, and through cathode voltage regulator 130. This, in turn, produces the desired indication of helix current across resistor 20.

It should be noted that an automatic quick-restart feature may be used in conjunction with the invention. The automatic quick restart applies full voltage within 200 msec or less following a shut-down. This allows for quick restart after a single arc, but the quick restart is not repeated; a subsequent shut-down causes the full restart sequence to be initiated, to prevent damage due to repeated quick restarts in the presence of a fault.

Other embodiments of the invention will be apparent to those skilled in the art. For example, while an analog protection circuit has been described and illustrated, a digitally controlled equivalent can also be used. The RF coupling into the helix may be by means of coaxial, waveguide or other types of transmission lines. While the terms "comparator" and "amplifier" have been used for clarity, they are in practice not very different.

What is claimed is:

1. A power and protective arrangement for a travelling-wave tube including a cathode, an anode, and a helix, said arrangement comprising:

cathode current sensing means coupled to said cathode for generating a cathode current signal representative of the cathode current of said travelling-wave tube;

helix current sensing means coupled to said helix for generating a helix current signal representative of the helix current of said travelling-wave tube;

controllable voltage generating means including a cathode current control input port and a shut-down input port, and also including output ports coupled to said cathode and said anode of said travelling-wave tube, for coupling between said cathode and said anode of said travelling-wave tube an operating voltage which is controllable in response to a cathode current control signal applied to said cathode current control input port, and which operating voltage is reduced to zero in response to a shut-down signal applied to said shut-down input port;

shut-down signal generating means coupled to said helix current sensing means and to said shut-down input port of said controllable cathode current generating means, for comparing said helix current signal with a reference signal, and for generating said shut-down signal when said helix current signal exceeds a particular value;

cathode current reference signal generating means including a control input port, for generating a cathode current reference signal;

cathode current controlling means coupled to said cathode voltage control input port of said controllable voltage generating means, to said cathode current sensing means, and to said cathode current reference signal generating means, for comparing said cathode current signal with said cathode current reference signal, and for generating a cathode current control error signal representing the difference between said cathode current signal and said cathode current reference signal, and for applying said cathode current control error signal to said cathode current control input port of said controllable cathode voltage generating means with a polarity selected to form a degenerative feedback loop which tends to maintain a constant ratio between said cathode current signal and said cathode current reference signal; and helix current drive limiting means coupled to said helix current sensing means and to said control input port of said cathode current reference signal generating means, for comparing said helix current signal with a reference value, for generating a cathode current reference threshold adjustment signal, and for coupling said cathode current reference threshold adjustment signal to said control input port of said cathode current reference signal generating means with a polarity selected for forming a degenerative feedback loop which tends to reduce said cathode current when said helix current increases, whereby, in the absence of an arc, the helix current tends to be limited to a value less than said particular value.

2. An arrangement according to claim 1, wherein:

said cathode current reference signal generating means includes a voltage divider, including first and second resistors serially connected across a reference voltage source, and having a tap a which said cathode current reference signal is generated, said cathode current reference signal generating means further comprising an impedance coupled between said tap and said control input port of said cathode current reference signal generating means; and said helix current drive limiting means includes amplifying means including a first input port (−) coupled to said helix current sensing means, a second input port (+) coupled to second reference signal generating means, and an output port coupled to said control input port of said cathode current reference signal generating means.

3. An arrangement according to claim 2, wherein said impedance includes unidirectional current conducting means.

4. An arrangement according to claim 2, further comprising frequency compensation means coupled between said first (−) port and said output port of said amplifying means.

5. An arrangement according to claim 2, further comprising unidirectional current conducting means coupled between said first (−) port and said output port of said amplifying means, for limiting the dynamic range of said amplifying means.

6. A method for operating a travelling-wave tube which includes a cathode, an anode, and a helix which is grounded, said method comprising the steps of:

applying a fixed negative voltage to said cathode;

applying a controllable negative voltage to said anode, which controllable negative voltage is more positive than said fixed negative voltage;

sensing the cathode current which results from said fixed cathode and controllable anode voltages, to produce a cathode current sense signal;

generating a controllable cathode current reference signal;

comparing said cathode current sense signal with said controllable cathode current reference signal to generate a cathode current error signal;

controlling said anode voltage in response to said cathode current error signal in a degenerative feedback manner, to thereby tend to maintain a constant cathode current in said travelling wave tube;

sensing the presence of electron current in said helix, for generating a helix current signal;

comparing said helix current signal with a reference signal representing a particular amount of helix current, to produce a shut-down signal;

setting said cathode and anode voltages to zero in response to said shut-down signal;

applying RF signal to said helix, which may vary somewhat in amplitude, as a result of which the operating point of said travelling wave tube may enter a saturation region and draw helix current, and, if said helix current reaches said particular amount, undesirably produce said shut-down;

comparing said helix current signal with a fixed value representing a helix current less than said particular amount, to thereby produce a helix current error signal;

controlling said controllable cathode current reference signal in response to said helix current error signal, to thereby control said cathode current reference signal in a degenerative feedback manner, to control said anode voltage in such a manner as to tend to maintain said cathode current at a value which results in said helix current remaining below said particular value.

* * * * *